(12) United States Patent
Pandey et al.

(10) Patent No.: US 10,388,778 B2
(45) Date of Patent: Aug. 20, 2019

(54) LOW RESISTANCE AND LEAKAGE DEVICE

(71) Applicant: Nexperia B.V., Nijmegen (NL)

(72) Inventors: Saurabh Pandey, Manchester (GB); Jan Sonsky, Leuven (BE)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/355,769

(22) Filed: Nov. 18, 2016

(65) Prior Publication Data

US 2018/0145165 A1    May 24, 2018

(51) Int. Cl.
| | |
|---|---|
| *H01L 29/778* | (2006.01) |
| *H01L 29/20* | (2006.01) |
| *H01L 29/47* | (2006.01) |
| *H01L 29/417* | (2006.01) |
| *H01L 29/872* | (2006.01) |

(52) U.S. Cl.
CPC ...... *H01L 29/7787* (2013.01); *H01L 29/2003* (2013.01); *H01L 29/41766* (2013.01); *H01L 29/475* (2013.01); *H01L 29/7786* (2013.01); *H01L 29/872* (2013.01)

(58) Field of Classification Search
CPC ............. H01L 29/7787; H01L 29/2003; H01L 29/475; H01L 29/7786; H01L 29/872
USPC .......................................................... 257/76
See application file for complete search history.

(56) References Cited

U.S. PATENT DOCUMENTS

| | | | |
|---|---|---|---|
| 9,391,187 B2 | 7/2016 | Hurkx et al. | |
| 2013/0126893 A1* | 5/2013 | Tanaka | H01L 29/2003 257/76 |
| 2015/0357456 A1* | 12/2015 | Hurkx | H01L 29/7787 257/76 |
| 2016/0118490 A1* | 4/2016 | Padmanabhan | H01L 27/0629 257/195 |

(Continued)

OTHER PUBLICATIONS

Lin, M. E. et al. "Low resistance ohmic contacts on wide band-gap GaN", App. Phys. Lett. 64 (8), 3 pgs. (Feb. 1994).

(Continued)

*Primary Examiner* — Tong-Ho Kim
(74) *Attorney, Agent, or Firm* — Ohlandt, Greeley, Ruggiero & Perle, L.L.P.

(57) ABSTRACT

A heterojunction semiconductor device is disclosed. The heterojunction semiconductor device includes a substrate and a multilayer structure disposed on the substrate. The multilayer structure includes a first layer comprising a first semiconductor disposed on top of the substrate, and a second layer comprising a second semiconductor disposed on top of the first layer to define an interface between the first layer and the second layer. The second semiconductor is different from the first semiconductor such that a Two-Dimensional Electron Gas forms adjacent to the interface. The device also includes a first terminal electrically coupled to a first area of the interface between the first layer and second layer and a second terminal electrically coupled to a second area of the interface between the first layer and second layer. The device also includes an electrically conducting channel comprising (Continued)

an implanted region at bottom and sidewalls. The electrically conducting channel is filled with a metal and the electrically conducting channel connects the second terminal and a region of the first layer such that electric charge can flow between the second terminal and the first layer.

15 Claims, 2 Drawing Sheets

(56) References Cited

U.S. PATENT DOCUMENTS

2017/0141270 A1\* 5/2017 Kaneda ................ H01L 33/325

OTHER PUBLICATIONS

Nakajima, A. et al. "High density 2-D hole gas induced by negative polarization at GaN/AlGaN heterointerface", Appl. Phys. Express 3, 3 pgs. (Dec. 2010).

\* cited by examiner

LOW RESISTANCE AND LEAKAGE DEVICE

BACKGROUND

In recent years, III-nitride (Gallium nitride (GaN) or Aluminum Gallium nitride (AlGaN), etc.) based high-mobility transistors (HEMT) and Schottky diodes have drawn a lot of attention because of their high potential to replace Si or SiC devices for High Voltage (HV) devices applications. Both the HEMT and the diode suffer from the problem that the on-state resistance ($R_{on}$) under dynamic (e.g., switching, pulsed, RF) conditions is significantly higher than under DC conditions.

D a Sec

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a heterojunction semiconductor device is disclosed. The heterojunction semiconductor device includes a substrate and a multilayer structure disposed on the substrate. The multilayer structure includes a first layer comprising a first semiconductor disposed on top of the substrate, a second layer comprising a second semiconductor disposed on top of the first layer to define an interface between the first layer and the second layer. The second semiconductor is different from the first semiconductor such that a Two-Dimensional Electron Gas (2DEG) forms adjacent to the interface, a first terminal electrically coupled to a first area of the interface between the first layer and second layer, a second terminal electrically coupled to a second area of the interface between the first layer and second layer, and an electrically conducting channel, wherein the electrically conducting channel connects the second terminal and a region of the first layer such that electric charge can flow between the second terminal and the first layer (e.g., so that electric charge can flow into the second terminal from the first layer).

The electrically conducting channel includes an implanted region at bottom and sidewalls, wherein the electrically conducting channel is filled with a metal and the electrically conducting channel connects the second terminal and a region of the first layer such that electric charge can flow between the second terminal and the first layer. The implanted region may be thermally annealed prior to filling the electrically conducting channel with the metal. The ion implantation can be performed using elements such as Mg, Cr, Zn, etc. for p-type and Si, Be, He, etc, for n-type Gallium nitride (GaN) layer. For example, the higher-defect-density region of the first layer may comprise a region underneath the second terminal and have a higher defect density than the rest of the first layer. The higher-defect-density region of the first layer may comprise a region underneath the second terminal and have a higher defect density than a region of the first layer underneath the first terminal. The higher-defect-density region of the first layer may comprise a region underneath the second terminal and have a higher defect density than a region between the first and second terminals. Defects introduce traps (i.e. states in the bandgap of the material) via which charge carriers can propagate (so-called hopping) under influence of a strong electric field.

The electrically conducting channel may have a higher conductivity than the first layer. The electrically conducting channel may have the same conductivity as, or a different conductivity than, the second terminal.

The conducting channel may be located below the second terminal within the area of the second terminal. That is, when viewed from above the conducting channel would be within the footprint of the second terminal.

Throughout the present specification, the descriptors relating to relative orientation and position, such as "back", "front", "top", "bottom" and "side" as well as any adjective and adverb derivatives thereof, are used in the sense of the orientation of the semiconductor device as presented in the drawings. However, such descriptors are not intended to be in any way limiting to an intended use of the described or claimed invention.

The conducting channel may be located below the second terminal and extend partially towards the first terminal. The electrically conducting channel may comprise a region of the first layer comprising defects. The defects may have been induced by implantation of one or more non-doping elements. In this context, a non-dopant element is an element which does not result in p-type or n-type regions when introduced into the semiconductor lattice. The non-dopant elements may comprise one or more of argon and nitrogen. The implantation doses may be in the range of 1e11 to 1e12 per cm2. An argon dose of around 1e13 per cm2 may be used.

The implantation dose may be element dependent. For example, a heavier element may require a lower dose to damage the crystal structure. The implanted area may extend, for example, from the second terminal towards the first terminal or in a patterned fashion (e.g. in stripes or dots). When implantation is used within the footprint of the second terminal (e.g. so that the implanted area is not between the second terminal and the first terminal) the dose of the implantation can be higher, up to the dose where it effectively removes the Two-Dimensional Electron Gas (2DEG).

The heterojunction semiconductor device may comprise a passivation layer comprising a semiconductor passivation layer disposed on top of the second layer. The passivation layer may comprise silicon nitride. The passivation layer may further comprise a dielectric layer disposed between the semiconductor passivation layer and the second layer. The passivation layer may comprise a semiconductor passivation layer in direct contact with the second layer.

The first semiconductor may be a first III-V semiconductor, and the second semiconductor may be a second III-V semiconductor.

The III-V semiconductors may comprise any metallic elements selected from group III of the periodic table together with any of the non-metallic elements selected from group V of the periodic table.

The III-V semiconductors may comprise one or more of the metallic elements aluminium, gallium and indium. The III-V semiconductors may comprise nitride semiconductors, or phosphide semiconductors, or arsenide semiconductors.

The III-V semiconductors may comprise any of the semiconductors Gallium Nitride, Aluminium Nitride, Indium Nitride, Aluminium Gallium Nitride, Aluminium Indium Nitride, Gallium Indium Nitride, Aluminium Gallium Indium Nitride, Gallium Phosphide, Aluminium Phosphide, Indium Phosphide, Aluminium Gallium Phosphide, Aluminium Indium Phosphide, Gallium Indium Phosphide, Aluminium Gallium Indium Phosphide, Gallium Arsenide, Aluminium Arsenide, Indium Arsenide, Aluminium Gallium Arsenide, Aluminium Indium Arsenide, Gallium Indium Arsenide, and Aluminium Gallium Indium Arsenide.

The first layer may be a p-type semiconductor doped with a first concentration of p-type dopants. The second layer may be an n-type semiconductor, or the second layer may be an undoped semiconductor, or the second layer may be a p-type semiconductor doped with a second concentration of p-type dopants where the second concentration is less than the first concentration.

The first layer may comprise Gallium Nitride. The first layer may be semi-insulating (e.g. having a resistivity typically higher than 1 M☐cm). The second layer may comprise Aluminium Gallium Nitride.

The electrical coupling of the first terminal to the heterojunction device may comprise a Schottky contact with the second layer and the electrical coupling of the second terminal to the heterojunction device may comprise an Ohmic contact with the second layer, such that the device is configured to comprise a Schottky diode. In this way, each of the first and second terminals is configured to be electrically coupled to an area of the interface between the first and second layers to interact with the Two-Dimensional Electron Gas.

The heterojunction semiconductor device may comprise a third terminal electrically coupled to a third area of the heterojunction device such that the first terminal is positioned between the second terminal and the third terminal. The heterojunction semiconductor device may further comprise a third terminal electrically coupled to a third area of the heterojunction device such that the first terminal is positioned between the second terminal and the third terminal. In this way, each of the first, second and third terminals is configured to be electrically coupled to an area of the interface between the first and second layers to interact with the Two-Dimensional Electron Gas.

The third terminal may comprise a source terminal; the second terminal may comprise a drain terminal; the first terminal may comprise a gate terminal; whereby the heterojunction semiconductor device is configured to comprise a High Electron Mobility Transistor (HEMT).

The heterojunction semiconductor device may comprise a dielectric layer disposed between the second layer and the semiconductor passivation layer. The third terminal includes a source terminal electrically coupled to the second layer such that electric charge can flow from the third terminal to the second layer. The second terminal includes a drain terminal electrically coupled the second layer such that electric charge can flow from the second layer into the second terminal. The first terminal includes a gate terminal disposed on top of the dielectric layer. The heterojunction semiconductor device is configured to comprise a Metal-Insulator-Semiconductor High Electron Mobility Transistor.

There may be provided an integrated circuit comprising any heterojunction semiconductor device disclosed herein.

The metal conducting channel may be provided in practice by first etching through to the first layer to form a recess (e.g., after dry etching the contact holes through the passivation layer, typically with a fluorine dry etch chemistry). Then the ohmic metal is deposited, contacting the region wherein the 2DEG will be formed in-use (as in conventional heterojunction devices) and the first layer (e.g., comprising p-type GaN). For GaN/AlGaN embodiments, the recess may be formed using a BCl3/Cl2-based dry etch chemistry.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Figure 1A:
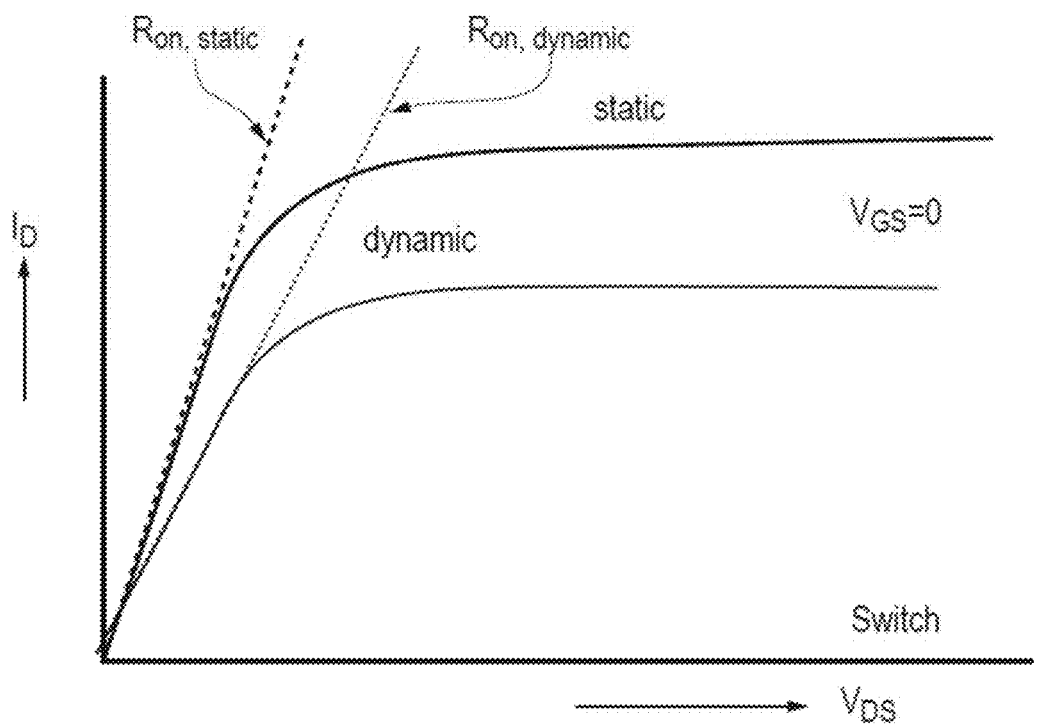
FIG. 1a is a graph showing how the voltage varies with current for a heterojunction transistor device in static and dynamic cases.

Note that figures are not drawn to scale. Intermediate steps between figure transitions have been omitted so as not to obfuscate the disclosure. Those intermediate steps are known to a person skilled in the art.

DETAILED DESCRIPTION

Many well-known fabrication steps, components, and connectors have been omitted or not described in details in the description so as not to obfuscate the present disclosure.

Gallium nitride (GaN) based high electron mobility transistors suffer from issue of Dynamic On Resistance ($R_{on}$) or current collapse during switching applications, where current collapse contribution is mainly contributed to surface and bulk (epi buffer) trapping. Surface trapping is normally minimized with several di-electric passivation schemes while bulk trapping is correlated to leakage paths in GaN epi. The conductivity of epi and leakage paths can alter the bulk trapping thus increasing the leakage paths in epi results in reduction in trapping i.e. low current collapse. This idea proposes to selectively convert the epi's conductivity by ion implant method and provide the leakage paths through metal filled trenches in order to achieve device with low current collapse and low leakage for high voltage switching applications.

Semiconductor heterojunction devices may comprise a first layer of semiconductor material disposed on a substrate and a second layer of a different semiconductor material disposed on the first layer. The interface between the two layers is the heterojunction. With the appropriate selection of the two different semiconductor materials, the difference between the two semiconductors will result in the formation of a Two-Dimensional Electron Gas (2DEG) at the interface. The 2DEG within the heterojunction device enables a high electrical current to flow through the device with low electrical resistance.

Such devices may be switched between an off state, in which the device can block a high drain-to-source voltage while having a low leakage current, and an on-state, where they carry a high current at a low voltage. Switching-off is achieved by applying a suitable voltage to a first terminal of the device such that the 2DEG disappears (or is significantly reduced). The design of these devices is such that an optimum trade-off is found between the power losses in on-state, off-state and during switching.

Suitable semiconductor materials for the first and second layers include the group III-V semiconductors, which comprise at least one metal element selected from group III of the periodic table, such as aluminum, gallium and indium, together with a non-metallic element selected from group V of the periodic table, such as nitrogen, phosphorus or arsenic. One or both of the layers may be unintentionally doped or doped to form a p-type semiconductor.

For high power and high temperature applications, devices comprising a first layer of GaN and a second layer of AlGaN can be particularly desirable. GaN/AlGaN devices are good candidates for high-efficiency power converters requiring fast switching, low conduction losses and the ability to operate at voltages up to 1 kV.

Heterojunction devices can be configured to form transistors by including a source terminal, a drain terminal, and a gate terminal disposed between the source terminal and the drain terminal. Alternatively, such devices can be configured to form a Schottky diode by including only two electrical terminals: an anode and a cathode.

U.S. Pat. No. 9,391,187 entitled "Semiconductor heterojunction device", which is being incorporated herein by reference in its entirety, addresses how to design heterojunction devices with lower electrical resistances, and in particular lower dynamic-on resistances, than previously known heterojunction devices. That is, for heterojunction devices such as high-electron-mobility transistors (HEMT) and Schottky diodes it may be desirable that the on-state resistance under dynamic (e.g., switching, pulsed, Radio Frequency (RF)) conditions is not significantly higher than under DC conditions.

Figure 1B:
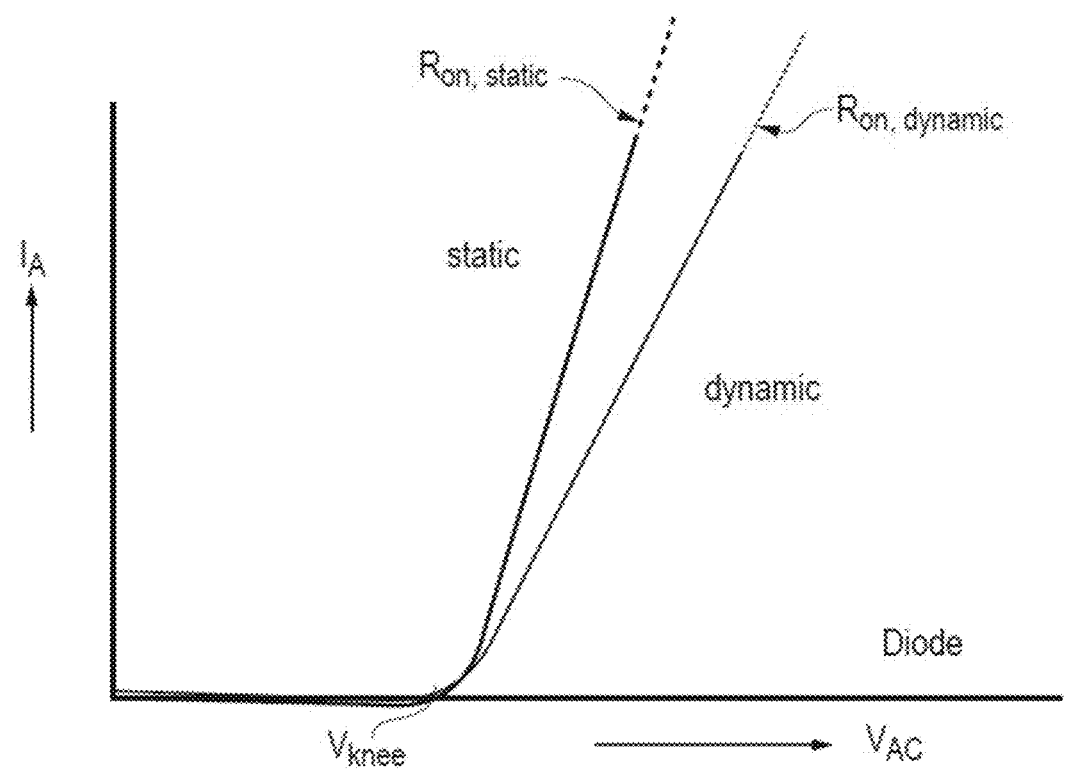
FIG. 1b is a graph showing how the voltage varies with current for a heterojunction Schottky diode in static and dynamic cases.

FIGS. 1a and 1b depict the situation where the on-state resistance under dynamic (e.g., switching, pulsed, RF) conditions is significantly higher than under DC conditions for a transistor and a Schottky diode respectively. In particular, FIG. 1a shows how the drain current of a HEMT varies with the voltage between the drain and the source terminals. FIG. 1b shows how the anode current of a Schottky diode varies with the voltage between the anode and the cathode. The higher the on-state resistance under dynamic conditions, the less suitable the device may be for switching or RF applications.

One reason for the high dynamic on-resistance shown in FIGS. 1a and 1b is electron trapping in either the passivation layers or in the first and second layer regions during high-voltage stress.

GaN buffers used in high voltage GaN HEMT epitaxy are mostly semi-insulating (S.I.) GaN layers with very high resistance. Semi-insulating GaN layers are formed by doping the GaN layers with species like C, Fe, Mg, Ni, which is important to achieve high breakdown voltage.

U.S. Pat. No. 9,391,187 proposes the benefit of using metal filled trenches (Ohmic and Schottky) on p-type Gallium nitride (p-GaN) layer in the Drain/drift contact region. These trenches provides a leakage path for holes, such that p-n junction formed between 2DEG and p-GaN layer is shorted. Those claims are valid and applicable only if GaN buffer is p-type and have enough active holes in GaN layer but they will not be applicable on semi-insulating GaN layers as very few holes are active (approximately $10^8$-$10^9$ atm/cm$^3$) in S. I. GaN layers. Forming a direct metal contact or trench on S. I. GaN layer will lead to a very high contact resistance which will not be enough to provide sufficient leakage path for holes.

The embodiment(s) described herein selectively converts S.I. GaN into either as p-type or n-type by introducing the ion implant method. The ion implantation can be done by using different species such as Mg, Cr, Zn etc. for p-type and Si, Be, He etc. for n-type GaN layer. Ion implantation is to be done in the trench regions/sidewalls which will help to form a good contact on p-GaN to provide the sufficient leakage path for holes. Trenches can be thermally annealed with optimized annealing temperature to form the better contact.

Figure 2A:
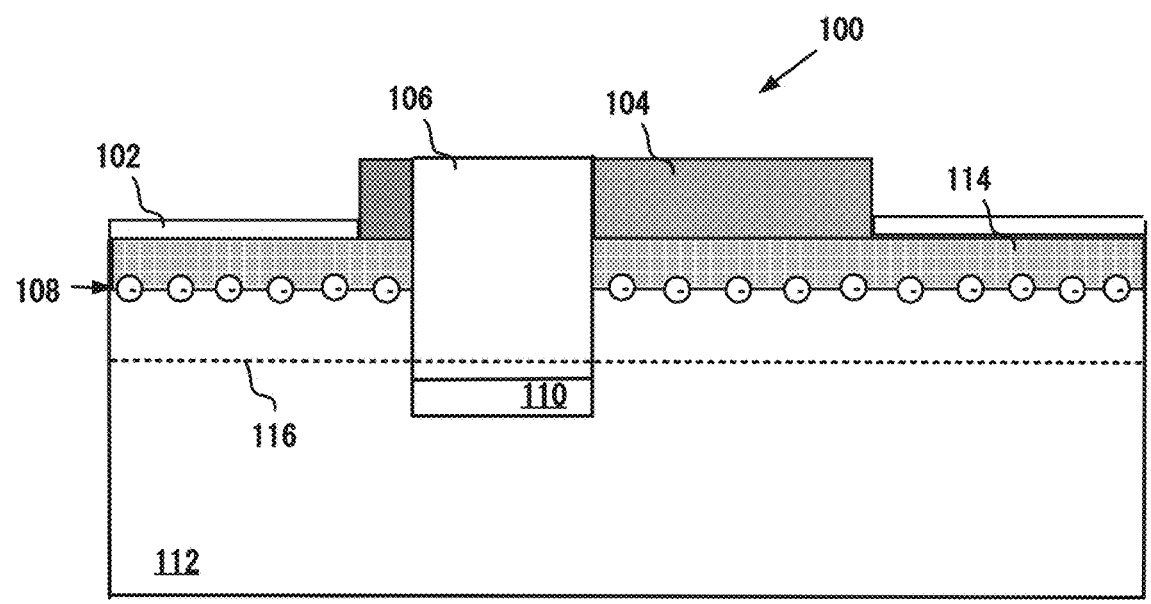
FIG. 2a is a cross-section of an improved HEMT heterojunction semiconductor device showing an implanted region in the trench.

FIG. 2a is a cross-section of an improved HEMT heterojunction semiconductor device 100 showing an implanted region 110 in a trench 106. The heterojunction semiconductor device 100 comprises a substrate (not shown). A multi-layer structure is disposed on the substrate, the multilayer structure comprising: a first layer 112 comprising a first semiconductor disposed, and a second layer 114 comprising a second semiconductor disposed on top of the first layer 112 to define an interface between the first layer 112 and the second layer 114. The second semiconductor is different from the first semiconductor such that a Two-Dimensional Electron Gas 108 forms adjacent to the interface. The heterojunction semiconductor device further comprises a first terminal electrically coupled to a first area of the interface between the first layer and second layer (not shown); and a second terminal 104 electrically coupled to a second area of the interface between the first layer and second layer. An electrically conducting channel in the trench 106 comprising a metal is also included. The electrically conducting channel connects the second terminal 104 and a region of the first layer 112 such that electric charge can flow between the second terminal 104 and the first layer 112 thereby electrically coupling the first layer 112 to the second terminal 104 and so preventing locally the formation of a deep depletion zone. A dielectric layer 102 is formed, which is then etched to form the second terminal 104. The line 116 represents a depletion edge. The depletion edge 116 represents an insulating region within a conductive, doped semiconductor material where the mobile charge carriers have been diffused away, or have been forced away by an electric field. The only elements left in the depletion region are ionized donor or acceptor impurities.

After the trench 106 is formed, depending upon the type of device 100 and prior to filling the trench with metal, an ion implantation process is performed on the sidewalls and bottom of the trench 106, to form an implanted region 110. The ion implantation can be done by using different species such as Mg, Cr, Zn etc. for p-type and Si, Be, He etc. for n-type GaN layer. In some embodiments, the trench 106 can be thermally annealed with optimized annealing temperature to form the better contact.

Figure 2B:
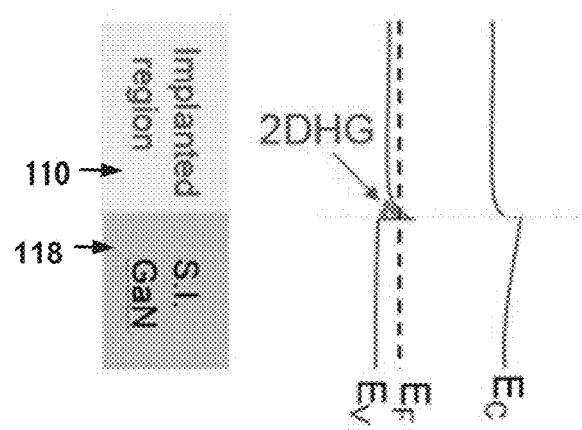
FIG. 2b illustrates the characteristics of the junction between the implanted region and a layer.

FIG. 2b shows that under the trench 106, converted p-type GaN interface 118 with semi-insulating (S.I.) GaN could also form a two dimensional hole gas (2DHG) which improves the performance. Embodiments herein are also suitable for making Ohmic/Schottky contact on S.I. III-nitride layers. Trenches with a different metal such as Ni or Pt, W, Pd, TiW(N) are known to form Schottky junctions to p-type GaN. Such a reverse-biased Schottky junction will be sufficiently leaky than a reverse-biased p-n junction because of the lower barrier. Selective area implantation will also help to maintain the high voltage GaN operation.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A heterojunction semiconductor device comprising:
a substrate;
a multilayer structure disposed on the substrate, the multilayer structure comprising:
a first layer comprising a first semiconductor disposed on top of the substrate;
a second layer comprising a second semiconductor disposed on top of the first layer to define an interface between the first layer and the second layer, wherein the second semiconductor is different from the first semiconductor so that a Two-Dimensional Electron Gas forms adjacent to the interface;
a first terminal electrically coupled to a first area of the interface between the first layer and second layer; and
a second terminal electrically coupled to a second area of the interface between the first layer and the second layer, and
an electrically conducting channel comprising an implanted region in a bottom and sidewalls of the electrically conducting channel, wherein the electrically conducting channel is filled with a metal, and wherein the electrically conducting channel connects the second terminal and a region of the first layer so that an electric charge can flow between the second terminal and the first layer,
wherein the implanted region does not touch the second layer, and
wherein the implanted region is beneath a depletion edge in the first layer of the heterojunction semiconductor device.

2. The heterojunction semiconductor device of claim 1, wherein the electrically conducting channel has a different conductivity than the second terminal.

3. The heterojunction semiconductor device of claim 1, wherein the electrically conducting channel comprises a region of the first layer comprising defects, the defects induced by implantation of one or more non-doping elements.

4. The heterojunction semiconductor device of claim 1, wherein the bottom and the sidewalls are ion implanted using one of elements Mg, Cr and Zn for p-type Gallium nitride (GaN) layer and Si, Be and He for n-type GaN layer.

5. The heterojunction semiconductor device of claim 1, wherein the electrically conducting channel is located below the second terminal within the area of the second terminal.

6. The heterojunction semiconductor device of claim 1, wherein the electrically conducting channel is located below the second terminal and extends partially towards the first terminal.

7. The heterojunction semiconductor device of claim 1, wherein the heterojunction semiconductor device comprises a passivation layer comprising a semiconductor passivation layer disposed on top of the second layer.

8. The heterojunction semiconductor device of claim 1, wherein the first semiconductor is a first III-V semiconductor, and the second semiconductor is a second III-V semiconductor.

9. The heterojunction semiconductor device of claim 1, wherein the first layer comprises Gallium Nitride.

10. The heterojunction semiconductor device of claim 1, wherein the second layer comprises Aluminium Gallium Nitride.

11. The heterojunction semiconductor device of claim 1, wherein the electrical coupling of the first terminal to the heterojunction semiconductor device comprises a Schottky contact with the second layer and the electrical coupling of the second terminal to the heterojunction device comprises an Ohmic contact with the second layer, such that the device is configured to comprise a Schottky diode.

12. The heterojunction semiconductor device of claim 1, further comprising a third terminal electrically coupled to a third area of the heterojunction device such that the first terminal is positioned between the second terminal and the third terminal.

13. The heterojunction semiconductor device of claim 12, wherein:
the third terminal comprises a source terminal;
the second terminal comprises a drain terminal;
the first terminal comprises a gate terminal;
whereby the heterojunction semiconductor device is configured to comprise a High Electron Mobility Transistor.

14. The heterojunction semiconductor device of claim 12, further comprising a dielectric layer disposed between the second layer and the semiconductor passivation layer, wherein:

the third terminal comprises a source terminal electrically coupled to the second layer such that electric charge can flow from the third terminal to the second layer;

the second terminal comprises a drain terminal electrically coupled the second layer such that electric charge can flow from the second layer into the second terminal;

the first terminal comprises a gate terminal disposed on top of the dielectric layer;

whereby the heterojunction semiconductor device is configured to comprise a Metal-Insulator-Semiconductor High Electron Mobility Transistor.

15. An integrated circuit comprising the heterojunction semiconductor device of claim 1.

* * * * *